United States Patent [19]

Pate

[11] 4,297,527

[45] Oct. 27, 1981

[54] INPUT GAIN ADJUSTING APPARATUS AND METHOD

[75] Inventor: Jerry W. Pate, Houston, Tex.

[73] Assignee: E-Systems, Inc., Dallas, Tex.

[21] Appl. No.: 35,004

[22] Filed: May 1, 1979

[51] Int. Cl.³ ............................................. H03G 3/30
[52] U.S. Cl. .............................. 179/1 VC; 179/1 VL; 179/1 P
[58] Field of Search ................. 179/1 VC, 1 VL, 1 P, 179/1 HF, 100.1 VC, 170.8; 330/144, 124 R; 455/234; 340/148

[56] References Cited

U.S. PATENT DOCUMENTS 4,068,092  1/1978  Ikoma et al. ...................... 179/1 P

OTHER PUBLICATIONS

IBM Technical Disclosure Bulletin, vol. 19, No. 3, Aug. 1976, pp. 1005-1006, M. L. Shulman et al., "Power Level Control in TDMA Satellite Communication System".

Primary Examiner—Joseph A. Popek
Attorney, Agent, or Firm—Robert V. Wilder; Albert M. Crowder, Jr.

[57] ABSTRACT

In a voice operated gain adjust for a voice processor included an input range adjust (10), a sixteen channel amplifier (12), an analog to digital converter (14) and a microcomputer (16). An audio signal including voice signals and background noise is applied to the input of the range adjust (10) and the amplifier (12). The output of the input range adjust (10) is applied through the A/D converter (14) to the microcomputer (16). The microcomputer (16) distinguishes voice signals from background noise and controls the gain of the amplifier (12) in accordance with the amplitude of the voice signals. Also, the microcomputer (16) controls the gain of the input range adjust (10) so that the input signal to the A/D converter (14) is within the operating range of the converter (14).

12 Claims, 6 Drawing Figures

INPUT GAIN ADJUSTING APPARATUS AND METHOD

TECHNICAL FIELD

The present invention relates to an apparatus and method for adjusting the gain of an amplifier to adjust the amplitude of an input signal in a communication system, and particularly relates to a voice operated gain adjust apparatus and method for adjusting the amplitude of an input signal to a voice processor to optimize the amplitude of voice signals for further processing in the voice processor.

BACKGROUND OF INVENTION

Gain adjust circuits are often employed at the input of various communication systems for adjusting the amplitude of an input signal. In most voice processors, a voice operated gain adjust circuit (VOGAD) is usually found in the analog audio input section of the system. The VOGAD monitors the amplitude of voice signals in the input signal and multiplies the input signal by a gain factor such that the voice signals are at a desired amplitude level for further processing in the voice processor.

Voice processor systems often employ a hand set with a push-to-talk control button. In this type of system, conventional VOGADs provide adequate performance by keying their operation to the signal from the push-to-talk control button. Usually, the VOGAD is enabled when the button is depressed. However, in many commercial environments of voice processors, push-to-talk type control is not used. In commercial environments, such as in a telephone system interface or in computer room applications, a high level of background noise may be present.

Background noise and changing input levels have been found to interfere with the operation of most known conventional VOGADs. In such noisy environments, conventional VOGADs often overamplify or underamplify the input signal to the voice processor so that the voice signal is not at a desired amplitude.

Thus, a need has arisen for a new VOGAD capable of performing properly in a noisy environment in which an input signal includes background noise as well as the desired signal. In particular, a need is felt for a VOGAD that distinguishes between voice signals and background noise and that is capable of amplifying the input signal to the voice processor in response to the amplitude of the voice signals alone.

SUMMARY OF INVENTION

The present invention solves the foregoing and other problems associated with VOGADs by providing a novel apparatus incorporating control circuitry to perform a novel technique for adjusting gain of an amplifier in response to an input signal. In accordance with the present invention, a gain adjust is provided for use in a communications system which receives an input signal that includes a desired signal and noise. An amplifier is connected for receiving the input signal and includes an adjustment circuit for controlling the gain of the amplifier. Control circuitry is responsive to the input signal and distinguishes the desired signal from the noise. The control circuitry controls the gain of the amplifier according to the amplitude of the desired signal.

In an embodiment of the present invention, the gain adjust includes a preamplifier for receiving the input signal. The preamplifier includes a preamplifier adjustment circuit for adjusting the gain thereof. An analog to digital converter is responsive to the output of the preamplifier for sampling the input signal and converting the input signal samples into a digital input signal that corresponds to the analog input signal multiplied by the gain of the preamplifier. The control circuitry is responsive to the digital input signal to control the gain of the preamplifier so that the output of the preamplifier is within the operating range of the analog to digital converter.

In accordance with an embodiment of the present invention, a voice operated gain adjust is provided for use in a voice processor that receives an input signal including voice signals and noise. An analog to digital converter is provided for producing a digital input signal corresponding to the analog input signal. Control circuitry is responsive to the digital input signal for determining the average absolute amplitude of the input over a selected sample time period. The maximum absolute amplitude of the input signal during this sample time period is also determined by the microcomputer. A selected adjustment cycle includes a plurality of sample periods. During the adjustment cycle, the average absolute amplitude and the maximum absolute amplitude are determined for each sample period in the adjustment cycle. A comparison is performed to determine which of the plurality of the maximum amplitude in an adjustment cycle is the largest and to determine in which sample period the largest maximum amplitude occurred. A sliding average of the average absolute amplitudes is also taken over a sliding time period. This sliding average is used to determine a noise threshold. The gain adjust includes an amplifier having a variable gain for amplifying the analog input signal. The gain of the amplifier is adjusted according to the average absolute amplitude of the sample period in which the largest maximum amplitude occurred. However, the control circuitry adjusts the gain of the amplifier only when it is determined that the largest maximum absolute amplitude determined in an adjustment cycle is greater than the noise threshold. In this manner, the gain of the amplifier is adjusted in response to the amplitude of voice signals in the analog input signal.

In accordance with an embodiment of the present invention, the above described voice operated gain adjust circuit (VOGAD) also includes an input range adjust for sampling at a predetermined frequency, amplifying and holding the analog input signal. The gain of the input range adjust is variable through a selected number of different gains. The analog to digital converter is connected to the output of the range adjust and produces the digital input signal corresponding to the analog input signal multiplied by the gain of the input range adjust. The control circuitry is operable to control the gain of the input range adjust so that the output thereof is within the operating range of the analog to digital converter.

In accordance with an embodiment of the present invention, the frequency of the input signal is monitored by the control circuitry by counting the number of positive to negative transistions in a selected time period. The frequency of the input signal is sampled for a plurality of selected time periods during one adjustment cycle. Gain adjustment of the amplifier is allowed for an adjustment cycle only if the frequency of the analog input signal is within predetermined frequency criteria. If a predetermined number of consecutive frequency samples in a single adjustment cycle fall within a frequency qualification range, the control circuitry is permitted to adjust the gain of the amplifier. However, if during an adjustment cycle, the predetermined number of consecutive frequency samples within the qualification range does not occur, the control circuitry is prevented from adjusting the gain of the amplifier.

In the preferred embodiment, an adjustment cycle includes twelve time periods in which the frequency of the input signal is determined. If the frequency of the input signal falls within the qualification frequency range indicating the presence of voice signals for three consecutive time periods in the adjustment cycle, then the control circuitry is permitted to adjust the gain of the amplifier providing other conditions are correct. However, if no three consecutive time periods have an input frequency falling within the qualification range, the control circuitry is prevented from adjusting the gain of the amplifier for the adjustment cycle.

In accordance with the present invention, a method of adjusting the amplitude of an input signal including a desired signal and background noise is provided. The input signal is monitored and an average absolute amplitude of the input signal is calculated over a first period of time. The maximum absolute amplitude of the input signal over this first period of time is also determined. A second time period or adjustment cycle includes a plurality of first time periods. The average absolute amplitude of the input signal in an adjustment cycle is determined by averaging the average absolute amplitude of the plurality of first time periods occurring in the adjustment cycle. The largest of the maximum absolute amplitudes and the particular first time period in which it occurred are also determined for each adjustment cycle. The average absolute amplitude for an adjustment cycle is used to calculate a sliding average for a sliding time period. A threshold is determined by adding a predetermined amount to this sliding average. The largest maximum absolute amplitude is compared to the threshold to determine which is greater. The largest maximum absolute amplitude being greater indicates the presence of the desired signal. The frequency of the input signal is also monitored to determine whether the input signal frequency is within predetermined frequency criteria indicating the presence of the desired signal. Then, the gain of the amplifier is adjusted to adjust the amplitude of the input signal in accordance with the average absolute amplitude occurring in the same first time period as the largest maximum absolute amplitude. However, the gain is adjusted only if the largest maximum absolute amplitude is greater than the threshold and only if the input signal frequency is within the predetermined frequency criteria.

In accordance with the present invention, a method of adjusting the amplitude of an analog input signal that includes speech signals and background noise comprises the following steps: converting the analog input signal into a digital input signal; digitally processing the digital input signal for detecting the speech signals in the presence of background noise; producing a control signal in accordance with the amplitude of the speech signals only when the speech signals are detected; and adjusting the gain of an amplifier to adjust the amplitude of the input signal in response to the control signal in accordance with predetermined adjustment criteria.

BRIEF DESCRIPTION OF THE DRAWINGS

The present invention may best be understood by those of ordinary skill in the art by reference to the following Detailed Description when considered in conjunction with the accompanying Drawings in which.

DETAILED DESCRIPTION

Figure 1:
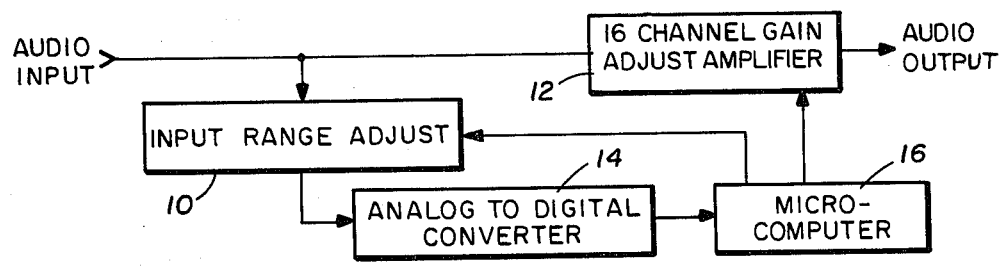
FIG. 1 is a block diagram of the preferred embodiment of the invention showing a voice operated gain adjust.

Referring now to the drawings in which like reference characters designate like or corresponding parts throughout the several views, there is shown in FIG. 1 a block diagram of the preferred embodiment of the invention, a voice operated gain adjust. An audio input signal is applied to an input range adjust 10 and a sixteen channel gain adjust amplifier 12. The audio input signal includes voice signals as well as background noise. The term background noise will be taken to include sounds such as produced by slamming doors or the operation of typewriters and printers, as well as electrical noise and other noise commonly present in communications systems.

The input range adjust 10 samples and amplifies the audio input signal and holds such signal at its output, thus, performing a sample and hold function. The output of the input range adjust 10 is applied to an analog to digital converter 14 which produces a digital input signal corresponding to the audio input signal multiplied by the gain of the input range adjust 10. The digital input signal from the analog to digital converter 14 is applied to a microcomputer 16 that is used as control circuitry in the present invention for controlling the gain of the input gain adjust 10 and the amplifier 12.

The microcomputer 16 is programmed to control the gain of input range adjust 10 and the amplifier 12 in response to the digital input signal. Every digital input signal transmitted to the microcomputer 16 is examined to determine whether the output of the input range adjust 10 is within the operating range of the analog to digital converter 14. If it is determined that this output signal is too small, the gain of the input range adjust 10 is increased. If the output signal is too large, the gain of the input range adjust 10 is diminished. If the output signal is too large and the input range adjust 10 is presently operating at its lowest gain, it is assumed that the audio input signal is overdriving the amplifier 12. Thus, when this latter condition occurs, the gain of the amplifier 12 is decreased.

The microcomputer 16 is programmed to distinguish voice signals from background noise. When the presence of voice signals is detected, the peak amplitude of the voice signal is used to determine the proper gain for the sixteen channel gain adjust amplifier 12. Thus, when voice signals are detected by the microcomputer 16, a control signal is transmitted to the amplifier 12 to adjust the gain of the amplifier to a proper level for the voice signals of the incoming audio input signal. In this manner, the audio output of the amplifier 12 includes voice signals amplified to a proper level for further processing in a voice processor. The operation of the input range adjust 10, the analog to digital converter 14, the microcomputer 16, and the amplifier 12 will be hereinafter described in greater detail.

Figure 2:
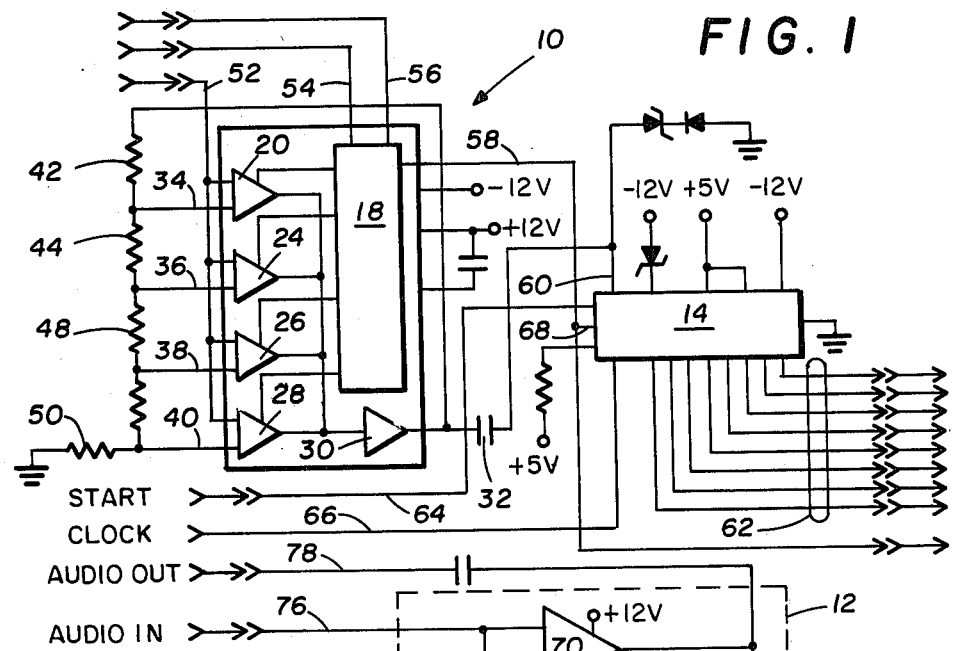
FIG. 2 is a schematic diagram of an analog to digital converter, an input range adjust for the analog to digital converter, and an audio amplifier having a variable gain that is controlled by a plurality of feedback loops.
Figure 2:
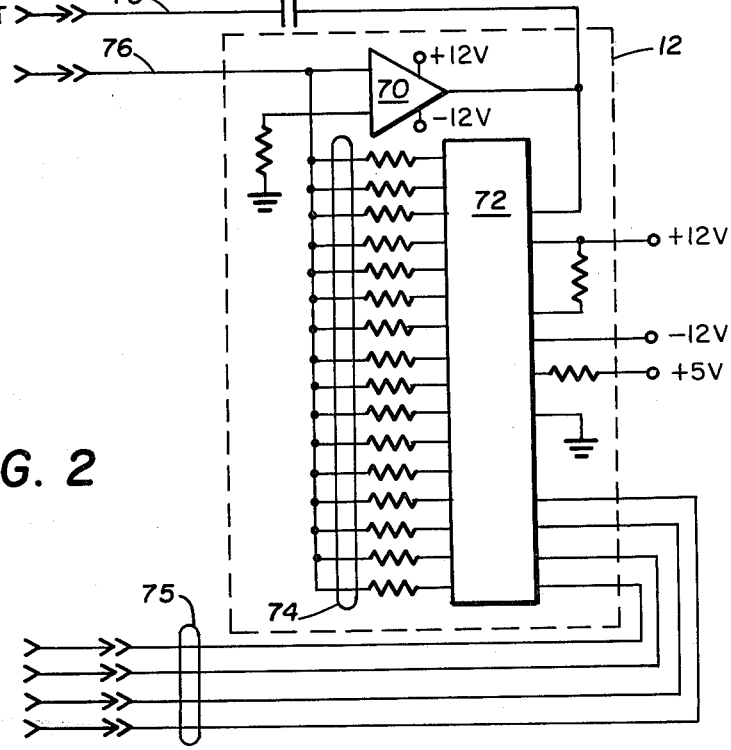

Referring now to FIG. 2, the analog components of the present invention are shown in detail. Specifically, the input range adjust 10, the analog to digital converter 14, and the gain adjust amplifier 12 are schematically shown in FIG. 2.

The input range adjust 10 includes a switching circuit 18 interconnected with four amplifiers 20, 24, 26 and 28 that are manufactured as one component by Harris, Semiconductor Products Division, part no. HA1-2405-5. The output of each of these amplifiers is connected to the mixing amplifier 30 whose output is connected to a one microfarad capacitor 32. Capacitor 32 holds the output voltage of the mixing amplifier 30 which constitutes the output of the input range adjust 10.

The gain of the amplifiers 20, 24, 26 and 28 is controlled by the feedback lines 34, 36, 38 and 40, respectively. Thus, the feedback loop to amplifier 20 includes the 32 k ohm resistor 42. The feedback loop to amplifier 24 includes the series connection of resistor 42 and a 4 k resistor 44. The feedback loop to the amplifier 26 includes the series connection of resistors 42, 44 and a 2 k resistor 46. Finally, the feedback loop to the amplifier 28 includes the series connection of resistors 42, 44, 46 and a 1 k resistor 48, and the line 40 is also connected to ground through a 1 k resistor 50. In this configuration, amplifier 20 has a gain of 5, amplifier 24 has a gain of 10, amplifier 26 has a gain of 20, and amplifier 28 has a gain of 40.

The switching circuit 18 selectively enables one of the amplifiers 20, 24, 26 or 28 for a predetermined length of time to sample the audio input signal. The audio input signal is applied to the input of each of these amplifiers through line 52. Thus, the switching circuit 18, by selecting one of four amplifiers, is operable to select the gain of the input range adjust 10.

The gain of the input range adjust 10 is controlled by the microcomputer 16 through control lines 54 and 56. The voltage appearing on lines 54 and 56 determines which of the amplifiers 20, 24, 26 or 28 is enabled by the switching circuit 18.

An end of conversion signal is also applied to the switching circuit 18 on the control line 58. The end of conversion signal indicates that the analog to digital converter 14 has completed a conversion. In response to the end of conversion signal on line 58, the switching circuit 18 is enabled and the audio input signal on line 52 is again sampled. The voltage detected on line 52 is amplified and held on the capacitor 32.

The output of the input range adjust 10 corresponds to the audio input signal multiplied by the selected gain of the input range adjust 10. This output is applied through line 60 to the analog to digital converter 14 that converts this analog signal into an eight bit digital word. The particular A/D converter used in the preferred embodiment is part no. ADC 0800 PD manufactured by National Semiconductor. The function of the amplifiers 20, 24, 26 and 28 is to amplify the audio input signal before it is applied to the A/D converter 14. These amplifiers are performing a preamplification function and, thus may be referred to collectively as a preamplifier. The output of the analog to digital converter 14 is applied to the microcomputer 16 through the eight output lines 62. The start signal is applied on line 64 to begin the operation of the analog to digital converter 14, and a clock signal is applied to the converter 14 through input line 66. The end of conversion signal is applied to line 58 through line 68 to indicate that the converter 14 has completed the conversion of an analog sample into a digital signal.

The sixteen channel gain adjust amplifier 12 includes an operational amplifier 70 (part no. 3403, manufactured by Fairchild), and a switching circuit 72 (part no. DG-605 BR, manufactured by Siliconix). The output of the amplifier 70 is connected to the input of the switching circuit 72, and the input of the amplifier 70 is connected to the switching circuit 72 through sixteen different resistive paths 74. The switching circuit 72 is operable to connect the output of the amplifier 70 through one of the sixteen different resistive paths 74 to the input of the amplifier 70. In this manner, the switching circuit 72 is operable to select the gain of the amplifier 70.

Each of the sixteen resistive paths 74 has a different resistance to provide a varying gain for the amplifier 70 according to which one of the resistive paths 74 is connected in a feedback loop with the amplifier 70. In the preferred embodiment, resistors are chosen for the sixteen resistive paths 74 so that the gain of the amplifier 70 may be incremented from 0 db to 15 db through 1 db steps. Thus, resistors are chosen to provide the following gains: 1.0, 1.1, 1.26, 1.33, 1.50, 1.78, 1.96, 2.16, 2.55, 3.14, 3.55, 3.92, 4.30, 4.70, and 5.29.

The operation of the switching circuits 72 is controlled by four control lines 75 that are connected to the microcomputer 16. A four bit digital word is transmitted from the microcomputer 16 through the control line 75 to the switching circuit 72 to select one of the sixteen different resistive paths 74. In this manner, the microcomputer 16 selects the feedback loop for the amplifier 70, thus controlling the gain of the amplifier.

The audio input signal is supplied to the input of the amplifier 70 on line 76. The output of the amplifier 70 corresponds to the audio input signal multiplied by a gain selected by the microcomputer 16. This output of amplifier 70 is transmitted on line 78 for use in a communication system such as a voice processor.

Figure 3:
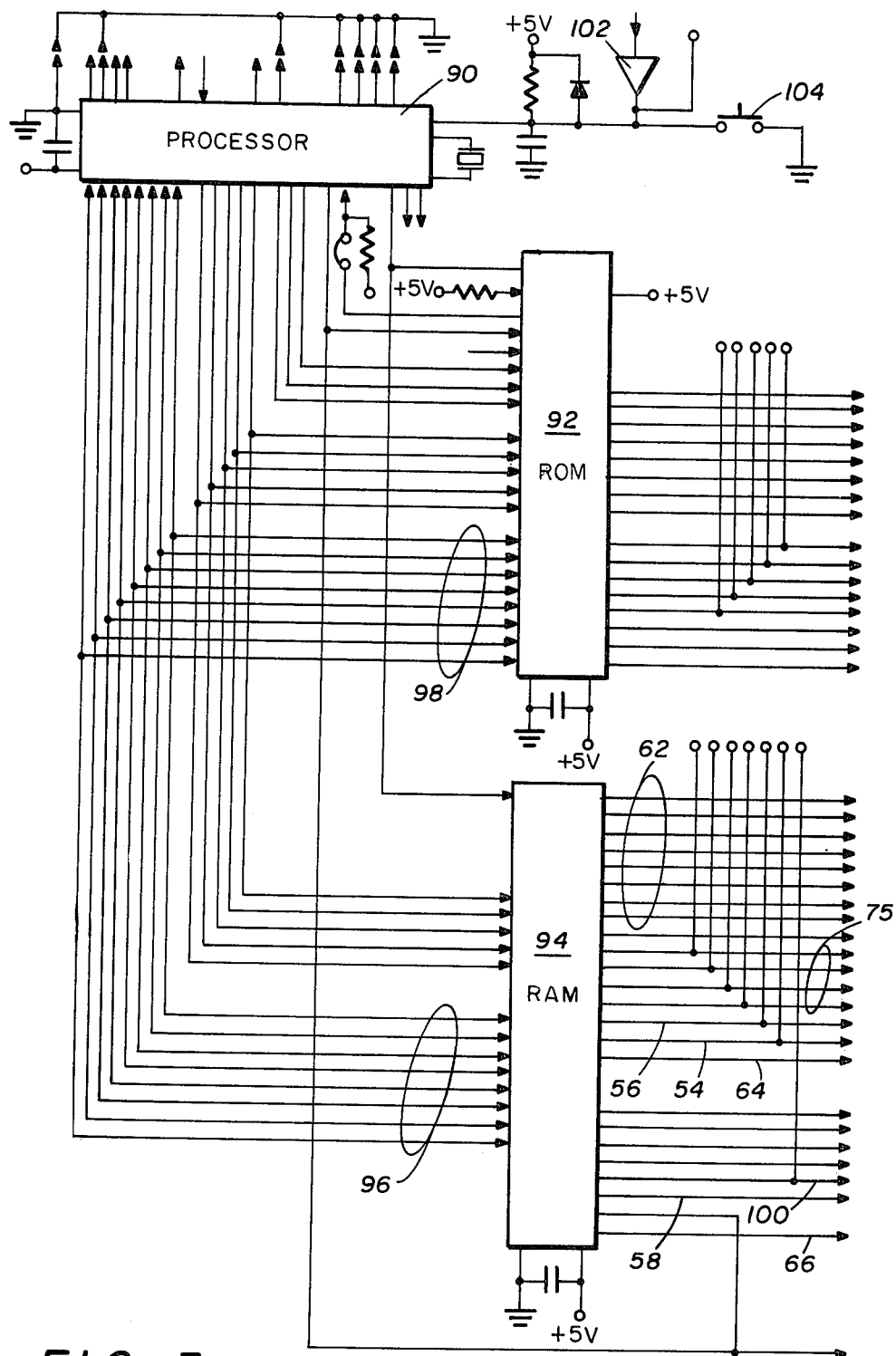
FIG. 3 is a schematic diagram of the microcomputer used in the preferred embodiment of the invention.

Referring now to FIG. 3, there is shown a schematic diagram of a microcomputer 16. The microcomputer includes an 8085 microprocessor 90 interconnected with an 8755A read only memory (ROM) 92 and an 8156 random access memory (RAM) 94, all of which are manufactured by Intel Corporation. The microcomputer 16 is interconnected basically as the 8085 minimal system as shown on page 2–22 of the MCS-85 TM USERS MANUAL published January 1978 by Intel Corporation. The interconnections between and the operations of the processor 90, the ROM 92 and the RAM 94 are described in the USERS MANUAL.

An eight bit digital word is input into the RAM 94 on lines 62 and constitutes a digital input signal corresponding to the audio input signal multiplied by the gain of the input range adjust 10. Lines 75 are interconnected between the RAM 94 and the switching circuit 72 for controlling the gain of the amplifier 70 shown in FIG. 2. Likewise, lines 54 and 56 are connected between the RAM 94 and the switching circuit 18 shown in FIG. 2. The end of conversion signal is applied to the RAM 94 on line 58, and the clock signal is connected to the RAM 94 on line 66. The start signal is transmitted on line 64.

An inhibit signal may be applied to the RAM 94 through the inhibit line 100. The inhibit signal is generated externally, such as by the push button of a push to talk hand set. When the inhibit signal is present, the microcomputer 16 will not adjust the gain of the amplifier 12.

A reset signal may be applied to the processor 90 through line 102. Such reset signal may be generated by any appropriate external source. Alternately, a reset button 104 may be actuated to apply a reset signal to the processor 90. When the reset signal appears, the processor 90 will cause a return to the beginning of the program and execution will start again.

A flow chart is shown in FIGS. 4a, 4b, 4c and 4d using standard symbolism and illustrating the operation of the microcomputer 16.

Figure 4A:
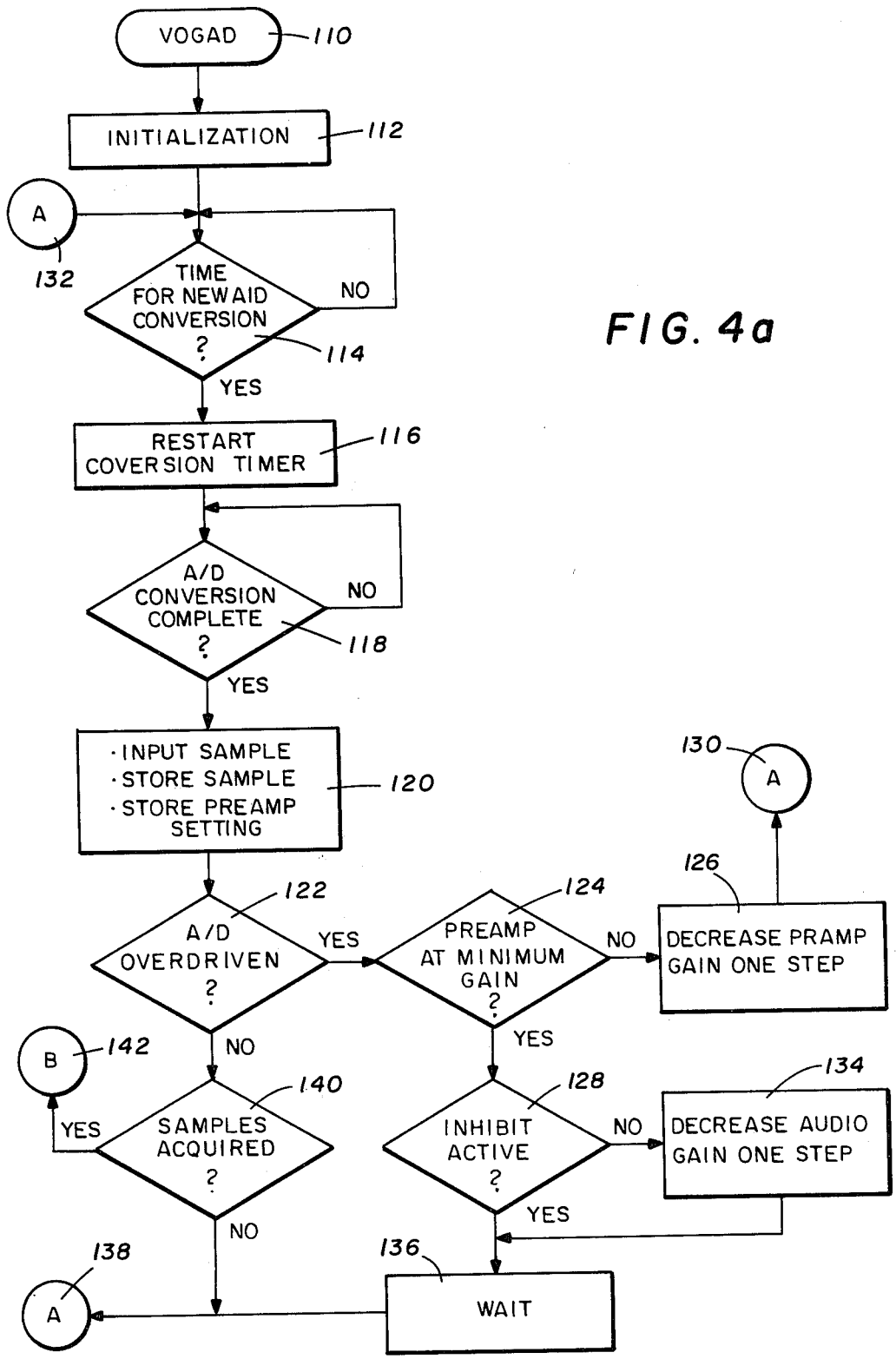
FIGS. 4a, 4b and 4c are a flow chart depicting the operation of the preferred embodiment of the invention.
Figure 4B:
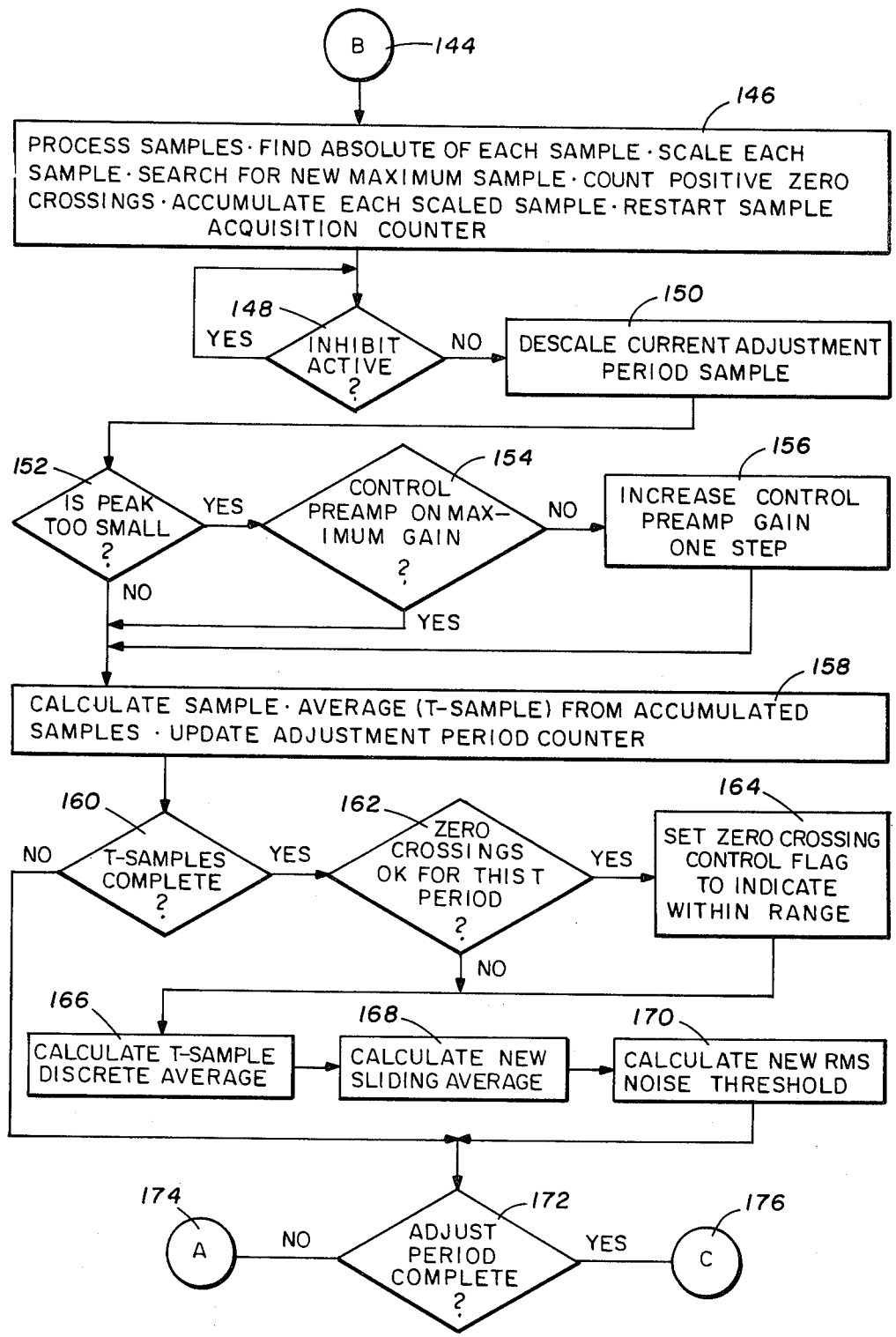
Figure 4C:
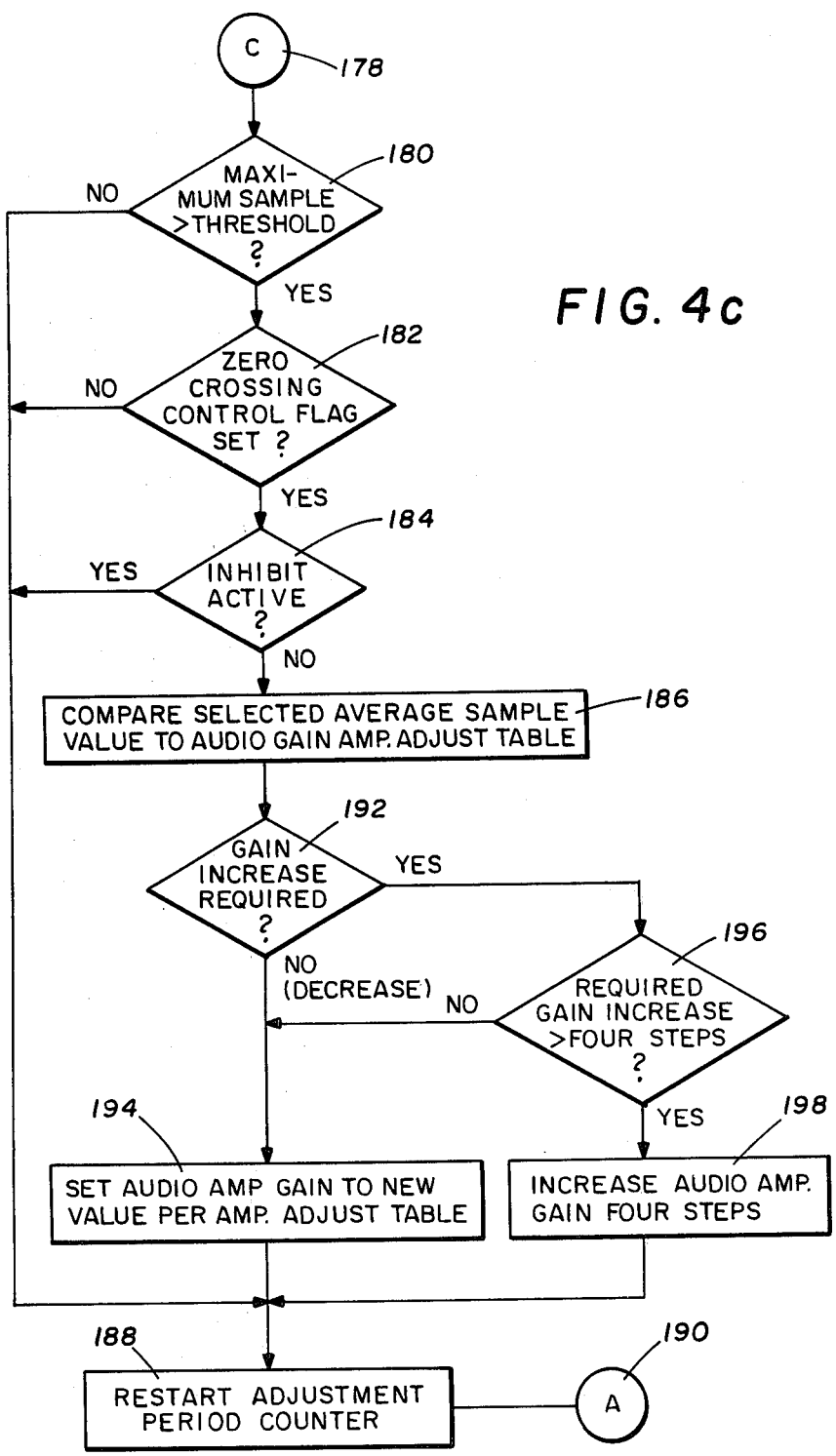

The flow chart of FIGS. 4a, 4b, and 4c are a simplified flow diagram illustrating the function of the present invention. The title, as shown in block 110, is VOGAD. The first step, shown in block 112, is initialization. During this step, all in/out ports of the microprocessor and all variables are given an initial value. In the next step, indicated by block 114, a microprogrammable timer is monitored to determine whether it is time for a new analog to digital conversion. The microprogrammable timer is set for a fixed period of time and determines the rate at which the audio input signal will be sampled. If it is time for a new conversion, the program will restart the conversion timer as indicated by block 116. If it is not time for a new conversion, block 114 will be repeated until the answer is yes. In the preferred embodiment of the present invention, the sample rate is 8,000 hertz. After the timer expires, it is restarted as indicated by block 116, and, as indicated by block 118, a check is made to insure the analog to digital conversion is complete. If the end of conversion signal is not present, the program will continue to check to determine whether the analog to digital conversion is complete.

In the next stop of the program, block 120, the digitized sample is stored in the RAM 94, and the gain setting of the input range adjust 10 is also stored in the RAM for use in later scaling of the sample.

After these values have been stored, the sample is then examined for an overdrive condition (block 122). If the sample is greater than a predetermined amount, a check is made to determine whether the input gain adjust 10 is set at minimum gain (block 124). If the input range adjust 10 is not set at its minimum gain, the gain thereof is decreased on step (block 126), and the program returns to the step indicated by circles 130 and 132.

If, however, the preamplifier of the input range adjust 10 is set at a minimum gain, it is assumed that the gain adjust amplifier 12 is also overdriven. At this point, the inhibit signal is checked (block 128) to determine whether a gain adjustment of the amplifier 12 is permissible. If so, the gain of amplifier 12 is decreased one step. If not, a wait period follows to insure that the input audio signal is not decreased due to a momentary large peak in the audio input signal. After the wait, the program is returned to block 114 as indicated by circles 138 and 132.

Referring again to block 122, if the analog to digital converter 14 is not overdriven, a check is made to determine whether a sufficient number of samples have been acquired (block 140). If so, the program proceeds to block 146 as indicated by circles 142 and 144. If not, the program returns to block 114, as indicated by circles 138 and 132 and sampling continues.

Provided sufficient samples have been acquired, the calculations indicated by block 146 are performed. First, the absolute value of each sample is found, and each sample is scaled to form a normalized number based on the gain setting of the input range adjust 10. Each sample is also checked to see if it is larger than any previous sample taken during the present input adjustment period. If it is, it becomes the new largest maximum sample value. This new maximum sample value and its corresponding average sample value are recorded. When a negative signed sample is followed by a positive signed sample, one zero crossing is counted. Each scaled sample is also accumulated or summed to generate a number that will be used to find the average of the present sample period. After the processing of block 146 is completed for all samples, the sample acquisition counter is restarted and the inhibit line is again checked for an inhibit signal (block 148). If the inhibit signal is present, the program remains at block 148 until the inhibit signal is absent.

Assuming the inhibit signal is absent, the current adjustment period sample is descaled to compensate for the gain of the input range adjust 10 (block 150). Next, the current peak sample is checked to determine if it is less than a predetermined amount that would indicate that the audio input signal is too weak for proper analysis. When the sample is found to be too small, the gain of the input range adjust 10 is increased. Should the gain already be set at a maximum gain, processing continues (blocks 152, 154 and 156).

Next, the computer calculates a sample average referred to as T-SAMPLE from accumulated samples. In the preferred embodiment, 32 samples are taken at 8,000 hertz, one sample every 125 microseconds. Each sample is scaled according to the value of the gain of the input range adjust 10. The absolute value of each sample is then generated, and this scaled absolute value is accumulated from 32 samples and then divided by 32. This yields an average value for a four millisecond time sample (32×125 microseconds equals four milliseconds). This is the sample given the label T-SAMPLE.

Also, as previously described, the samples taken every 125 microseconds are monitored to determine the maximum sample value, and this sample and its corresponding average sample value are recorded. The processing of the 32 samples requires six milliseconds. During this time no input samples are taken.

Each T-SAMPLE is stored in a buffer until a predetermined number of them are recorded. In the preferred embodiment, sixteen T-SAMPLES are stored. These samples are then averaged, and the average is labeled T-16 which represents an average over 160 milliseconds.

Also, the adjustment period counter is incremented in this step (block 158). This counter sets the normal gain adjustment interval for the variable gain section of the input range adjust 10.

Next, as indicated by block 160, a check is made to determine whether the appropriate number of T-SAMPLES have been generated. If so, a check is made to determine if the number of zero crossings is within the qualification range for this adjustment period. The zero crossing counter value has been recorded every 120 milliseconds. The value is calculated twelve times every adjustment cycle. If three consecutive zero crossing values fall into a specified qualification frequency range, then an adjustment of gain during the current adjustment cycle is approved, and a zero crossing control flag is set to indicate that it is permissible to adjust the gain (blocks 162 and 164). Next, as indicated by block 166, the T-SAMPLES are averaged to determine an average over a longer period of time. As previously described, in the preferred embodiment, sixteen T-SAMPLES are averaged to determine T-16.

Next, as indicated by block 168, a sliding average is determined. The sliding average is used as an indication of background noise level. In the preferred embodiment, the sliding average covers a period of approximately 5.12 seconds. The sliding average will be labeled as TWO, and is determined by the following equation:

$$TWO' = [T\text{-}16 + (16 \times TWO) + (8 \times TWO) + (4 \times TWO) + (2 \times TWO) + TWO] \div 32$$

The calculated value of TWO' replaces the old value of TWO in memory and is used for the next TWO calculation. After calculation of the sliding average TWO, a noise threshold value is calculated by simply adding a predetermined amount to the sliding average TWO (block 170). In the preferred embodiment, $26h$ (hexidecimal) is added to TWO to determine the threshold value ($26h = 38_{10}$).

In the next step (block 172), a check is made to determine whether the adjustment period is complete. At this point in the program, a decision is made as to whether it is time to adjust the audio gain of the amplifier 12. If the adjust period is not complete, the program returns to block 114 as indicated by circles 174 and 132. If the adjustment period is complete, the program continues to block 180 as indicated by circles 176 and 178. Several tests will now be made prior to permitting actual adjustment of the audio gain of amplifier 12.

The first check determines whether the maximum sample value for the adjustment cycle is greater than the threshold (block 180). If so, a check is made to determine whether or not the zero crossing flag has been set indicating that the frequency check indicates that the desired signal such as voice signals are present (block 182). If so, a check is made to determine whether an inhibit signal is present. If the inhibit signal is not present, the program proceeds to block 186.

However, if the answer to the checks in blocks 180 or 182 is no, or if the answer to the check of block 184 is yet, the program proceeds to block 188. In such case, the adjustment period counter is restarted and the program returns to block 114 as indicated by circles 190 and 132.

If the inhibit is not active (block 184), the average absolute amplitude for the sample period having the largest maximum amplitude taken during the adjustment period or cycle is compared to a table stored within the memory of the ROM 92. This table is simply a look-up table used to determine the appropriate gain for a particular amplitude audio input signal. Thus, the values in the table may be set according to desired performance or operating criteria.

In the next step (block 192), a check is made to determine whether a gain increase is required. If no change or a decrease in gain is required, the program proceeds to block 194 and the gain of the amplifier is set immediately and directly. However, if a gain increase is required, the program proceeds to block 196, and a check is made to determine whether the required gain increase is greater than four steps or four db. in the preferred embodiment. If so, the program proceeds to block 198, and the gain of amplifier 12 is increased only four steps regardless of the amount of gain increase called for by the look-up table. However, if the gain is equal to or less than four steps, the program proceeds to block 194, and the amplifier 12 is set with the new gain required by the table.

Finally, the program proceeds to block 188, the adjustment period counter is restarted, the program returns to the beginning (block 114), and the program is repeated.

It will be appreciated that many functions performed by the microcomputer 16 are redundant or repetitive. The same check steps may be performed more than once, or two different checks may be performed for the purpose of determining the same condition. For example, the presence or absence of a desired signal such as voice is determined using both an amplitude check and a frequency check. The presence or absence of the inhibit signal is also checked more than once during the program. It will be appreciated that this redundancy is provided to insure accurate operation of the voice operated gain adjust circuit of the present invention.

The program used in the preferred embodiment is listed hereinbelow. This program is specifically written for the minimal system using the 8085 processor manufactured by Intel Corporation. However, it will be understood that the program may be adapted for use in other processors or computers.

```
                     IVGF                    11-28-78

;
        ;
        ; _INTELLIGENT VOGAD BY JERRY PATE_____
        ; THIS IS THE REAL TIME CODE
        ; THAT RUNS IN THE THREE CHIP SYSTEM.
        ;
2E22    TFST    EQU     E22H
2E2E    TCP:    ORG     2E0CH
2E20    T:      DS      32
2E20    TF:     DS      2
2E22    T16:    DS      2
2E24    TWO:    DS      2
2E26    TFOINT: DS      1
2E27    TWCCNT: DS      1
2E2E    BACK:   DS      2
2E2A    THRESH: DS      2
2E2C    BDIF:   DS      1
2E2D    BDIFC:  DS      3
2E32            ORG     2E34H
```

```
2834            BFLG:   DS      1
2835            TFA:    DS      2
2837                    ORG     2850H
2850            ZT16:   DS      2
2852            ZTWC:   DS      2
2854            SAM:    DS      2
2856            ZTP:    DS      1
2857            ZTC:    DS      1
2858            LOOPC:  DS      1
2859            DIF:    DS      1
285A            SAMC:   DS      2
285C                    ORG     2880H
2880            SAMM:   DS      64

2800                    ORG     0
0000 C35000     START:  JMP     50H
0003                    ORG     8H
0008 C3114D             JMP     4D11H           ;RESTART VECTOR
000B C9                 RET
0050                    ORG     50H             ;MAIN PROGRAM STARTS HERE
                ;
                ;                               DEFINE DATA DIRECTION OF I
                ;                               PORTS. THESE PORTS ARE ON
                ;                               THE BASIC RAM (8156) SECTI
                ;                               OF THE 3-CHIP 8085 SYSTEM.
                ;                               PORT A (29) IS INPUT
                ;                               PORT B (2A) IS OUTPUT
                ;                               PORT C (2B) IS INPUT
                ;                               THE COMMAND PORT FOR THIS
                ;                               IS P28....
                ;                               ;PORT 1 ON THE 8755A HAS
                ;                               ;BI-DIRECTIONAL I-O AS
                ;                               ;DEFINED BY PORT 3
                ;
0050 3E42               MVI     A,42H           ;STOP TIMER,SET UP DIR REG
0052 D328               OUT     28H
                ;                               DEFINE STACK POINTER
0054 31FF28             LXI     SP,28FFH        ;THIS MAY BE DONE ELSEWHER
                ;                               SET UP INITIAL CONDITIONS
0057 3E08               MVI     A,08H
0059 D301               OUT     1
005B 3E08               MVI     A,08H           ;SET PORT 1 TO INPUT
005D D303               OUT     3
005F CDA403             CALL    TSW             ;CHECK SELF TEST SWITCH
                ;                               ;LOOP COUNTERS FOR A COMP
0062 212028             LXI     H,BDIFC         ;SET BDIFC =8
0065 3608               MVI     M,8
0067 215628             LXI     H,ZTP           ;SET ZTP=16
006A 3610               MVI     M,16
006C 23                 INX     H               ;SET ZTC=127
006D 367F               MVI     M,127
006F 218028             LXI     H,2880H
0072 225A28             SHLD    SAMC
0075 217628             LXI     H,TVCONT        ;SET TVCONT=32
0078 3620               MVI     M,32
007A 215828             LXI     H,LOOPC         ;SET LOOPC=32
007D 3620               MVI     M,32
007F 23                 INX     H               ;CLEAR DIFF
0080 3601               MVI     M,1
0082 210228             LXI     H,2             ;CLEAR TRANS SP
0085 223528             SHLD    TF
0088 225428             SHLD    SAM             ;CLEAR SAM
008B 223528             SHLD    BDIFC+1
008E 211628             LXI     H,TPOINT        ;SET TPOINT=124
0091 3618               MVI     M,18
                ;                               ;SET PARRIS AND CONTROL
0093 3E60               MVI     A,6H            ;THIS CLEARS H1 & H2 OUTPU
0095 D32A               OUT     2AH
0097 0605               MVI     B,5
0099 CDC922             CALL    WAIT            ;GENERATE START BIT LOW
009C FE01               CPI     21
009E F3                 DI
```

```
039F D32A              OUT   2AH
02A1 E6FE              ANI   0FEH     ;CLEAR BIT
02A3 D32A              OUT   2AH
02A5 FB                EI
02A6 D32A              OUT   2AH      ;OTHER OUTPUT INFO
                       ;
                       ;
                       ;                       ;INITIALIZE TIMER
                       ;
02A8 2148B1            LXI   H,329    ;SET TIMER FOR 125 US
02AB 7C                MOV   A,H
02AC F680              ORI   80H      ;SET BIT 7 OF EXPANSION
02AE D32D              OUT   2DH      ;TIMER MSB
02B0 7D                MOV   A,L
02B1 D32C              OUT   2CH
02B3 3E02              MVI   A,02H    ;START COUNTER AND LOAD TR
02B5 D328              OUT   28H      ;DATA DIRECTION
                       ;
                       ;                       ;MORE INITIALIZATIONS
                       ;
02B7 210000            LXI   H,00
02BA 222426            SHLD  TWO      ;CLEAR TWO
02BD 222828            SHLD  BACK     ;CLEAR BACK
02C0 222A28            SHLD  THRESH   ;CLEAR THRESH
02C3 222C28            SHLD  ZTWO     ;CLEAR ZTWO
02C6 C3D802            JMP   ON2      ;CONTINUE AT CONNECTOR 2
                       ;
                       ;
                       ;                       ;SUBR WAIT CREATES A PURE
                       ;                       ;DELAY OF (B) MILLISECONDS
                       ;                       ;B MUST LIE BETWEEN 1 & 12
                       ;                       ;INCLUSIVE. A 333NS CLOCK
                       ;                       ;ASSUMED.
02C9 C5       WAIT:    PUSH  B        ;SAVE B&C REG
02CA 0E9E              MVI   C,158    ;SET INNER LOOP
02CC 0D       W2:      DCR   C        ;INNER LOOP
02CD 00                NOP
02CE C2CC02             JNZ   W2
02D1 05                DCR   B
02D2 C2CA02            JNZ   WAIT+1   ;BRANCH IF NOT DONE
02D5 C1                POP   B
02D6 00                NOP

02D7 C9                RET            ;RETURN

;
                       ;                       ;PAGE 2 OF THE FLOW CHART
                       ;                       ;HERE. THIS SECTION CHECK
                       ;                       ;LINE ,CHECKS TIMER FLAG F
                       ;                       ;COMPLETE. TAKES ANOTHER S
                       ;                       ;IF A/D IS OUT OF RANGE AN
                       ;                       ;A16 GAIN 1 STEP IF UNIT I
                       ;                       ;IN 64 MS TIME INTERVALS..
                       ;
02D8 DB28    ON2:      IN    28H      ;READ BASIC RAM STATUS REG
02DA E640              ANI   40H      ;MASK FOR TIMER BIT
02DC CAD802            JZ    ON2      ;LOOP IF T FLAG IS LOW
02DF 3E02              MVI   A,02H    ;START 125 US TIMER
02E1 D028              OUT   28H
02E3 DB2B    W3:       IN    2BH      ;READ EOC LINE
02E5 E601              ANI   01H      ;MASK EOC BIT
02E7 CAE302            JZ    W3
02EA DB29              IN    29H      ;READ A/D PORT
02EC B7                ORA   A        ;SETS STATUS FLAGS
02ED 47                MOV   B,A
02EE C2F171            JNZ   ON3      ;JMP IF A IS NOT ALL 0'S
                       ;
                                               READ HARRIS AMP VALUE
02F1 DB2A              IN    2AH
02F3 4F                MOV   C,A      ;COPY A INTO C
02F4 E606              ANI   6H       ;MASK EVERYTHING BUT H1 &
02F6 47                MOV   B,A
```

```
0077 024401            JNZ   HERE3         ;IF NOT =0 THEN JUMP

;READ INHIBIT LINE
007A DB25              IN    25H
007C E640              ANI   22H           ;MASK EVERYTHING BUT INHIB
007E CA1801            JZ    OVER1         ;DON'T DECR A16 IF INHIBIT
0101 79                MOV   A,C           ;GET A16 STATUS
0102 0F                RRC                 ;ROTATE A16 STATUS INTO LS
0103 0F                RRC
0104 0F                RRC
0105 E60F              ANI   0FH
0107 CA1801            JZ    OVER1         ;DON'T DECR A16 IF 0 ALREA
010A 3D                DCR   A
010B 1678              MVI   D,78H         ;A16 MASK
010D 07                RLC                 ;ROTATE A16 VALUE INTO PRO
010E 07                RLC
010F 07                RLC
0110 47                MOV   B,A           ;SAVE A16 IN REG B
0111 79                MOV   A,C
0112 E687              ANI   87H           ;CLEAR OLD A16 VALUE
0114 B0                ORA   B             ;SET UP NEW A16 VALUE
                                           ;IN A REG WITH OTHER CONTR
0115 D32A              OUT   2AH           ;LOAD NEW A16 VALUE
0117 00                NOP
0118 0680      OVER1:  MVI   B,128         ;SET UP FOR128 MS WAIT
011A CDC922            CALL  WAIT          ;WAIT 64MS AND RETURN
011D 215728            LXI   H,2TC
0120 0                 NOP
0121 0                 NOP
                      ;
0122 3E02              MVI   A,002H        ;RESTART 125US TIMER
0124 D328              OUT   28H
0126 CD2001    HERE1:  CALL  STR1
0129 C3D020            JMP   ON2
012C DB28      STR1:   IN    28H           ;READ ECG PORT
012E E601              ANI   01H
0130 CA2001            JZ    STR1
0133 DB2A              IN    2AH           ;START NEW CONVERSION
0135 E6FE              ANI   0FEH          ;CLEAR BIT 0
0137 D32A              OUT   2AH
0139 F601              ORI   01            ;SET START BIT
013B F3                DI                  ;DISABLE INT--TIGHT TIMING
013C D32A              OUT   2AH
013F E6FE              ANI   0FEH          ;CLEAR START BIT IN STATUS
0141 D32A              OUT   2AH
0142 FB                EI
0143 C9                RET
0144 78        HERE6:  MOV   A,B
0145 D602              SUI   2H            ;DECREMENT H-VALUE
0147 47                MOV   B,A
0148 79                MOV   A,C
0149 E6F9              ANI   0F9H          ;SETUP MASK FOR H1 & H2
014B B0                ORA   B
014C D32A              OUT   2AH           ;OUTPUT NEW H-VALUES
014E C32601            JMP   HERE1

;THIS CODE STARTS THE 3RD
                                           ;PAGE OF THE FLOW CHART

0151 CD2C01    ON3:    CALL  STR1
0154 78                MOV   A,B
0155 2A2A28            LHLD  SAMC          ;SET SAMC POINTER
0158 77                MOV   M,A           ;STORE SAMPLE
0159 23                INX   H
015A DB2A              IN    2AH           ;READ H1 AND H2
015C 77                MOV   M,A
015D 23                INX   H
015E 222A28            SHLD  SAMC
0161 215028            LXI   H,1CCPO
0164 35                DCR   M             ;DECR LOOP COUNTER
0165 C25D00            JNZ   ON2
```

```
                ; THIS IS THE ZERO-CROSSING COUNTER
                ; FOR THE 32 SAMPLE INPUT 0168 212E28           LXI    H,BDIFC-1      ;LOAD LAST SAMPLE SIGN
016B 46               MOV    B,M
016C 118028           LXI    D,SAMM
016F 1A        R1:    LDAX   D              ;LOAD SAMPLE INTO A
0170 B7               ORA    A              ;SET FLAGS
0171 F27921           JP     OV3
0174 0601             MVI    B,1
0176 C38321           JMP    OV4
0179 78        OV3:   MOV    A,B            ;CHECK SIGN OF LAST SAMPLE
017A B7               ORA    A
017B CA8301           JZ     OV4
017E 23               INX    H              ;LAST SAM WAS NEG  THIS IS
017F 34               INR    M              ;SO INCR ZCC
0180 25               DCX    H
0181 0600             MVI    B,0
0183 13        OV4:   INX    D              ;SET D FOR NEXT SAMPLE
0184 13               INX    D
0185 7B               MOV    A,E
0186 FEC0             CPI    C0H            ;SEE IF ALL SAMPLES ARE CK
0188 C26F21           JNZ    R1
018B 00               NOP
018C 70               MOV    M,B

;
                ;
018D 218028           LXI    H,SAMM         ;LOAD BUFFER START
0190 7E        B2:    MOV    A,M
0191 23               INX    H
0192 47               MOV    B,A
0193 B7               ORA    A
0194 F29C21           JP     PCS            ;JUMP IF POSITIVE
0197 E67F             ANI    7FH
0199 C39F21           JMP    OVER2
019C 2F        PCS:   CMA
019D E67F             ANI    7FH
019F 5F        OVER2: MOV    E,A            ;MAG NUMBER IS NOW IN A
01A0 AF               XRA    A              ;MOVE TO E AND CLEAR D..
01A1 57               MOV    D,A
01A2 7E               MOV    A,M            ;GET R-VALUE
01A3 23               INX    H
01A4 E5               PUSH   H
01A5 2F               CMA
01A6 2F               CMA
01A7 E603             ANI    3              ;H-VALUE IN A
01A9 CD8103           CALL   LSHIFT         ;SCALE MAG VALUE IN DE
01AC 710228           LXI    B,TP           ;LOAD B WITH TP ADDRESS
01AF CD8AF3           CALL   COMP
01B2 D2C1A1           JNC    OVER3
01B5 03               INX    B              ;STORE CURRENT SAMPLE IN B
01B6 0B               DCX    B
01B7 7B               MOV    A,E
01B8 02               STAX   B              ;STORE LSB IN TPL
01B9 03               INX    B              ;STORE MSB IN TPM
01BA 7A               MOV    A,D
01BB 02               STAX   B
01BC 213428           LXI    H,FFLG         ;SET BYTE FLAG TO ZERO
01BF 3600             MVI    M,0            ;SO PRGG WILL SAVE T LATER
                ;
                                            ;ACCUMULATE SAMPLE
01C1 2A5428    OVER3: LHLD   SAM
01C4 19               DAD    D
01C5 225428           SHLD   SAM
01C8 EB               XCHG                  ;PUT SAM IN DE
                ;
01C9 E1               POP    H
01CA 7D               MOV    A,L
01CB FEC0             CPI    C0H
01CD C29021           JNZ    B2
01D0 215828           LXI    H,LOOPC        ;SET LOOPC=32
01D3 3620             MVI    M,32
01D5 219028           LXI    H,2880H
01D8 225A28           SHLD   SAMC
01DB CDA403    OV2:   CALL   TSW
```

```
01DF DB2B            IN    2BH              ;READ INHIBIT LINE STATUS
01E1 E602            ANI   02H
01E2 CADB01          JZ    OV2
                ;
                                             ;FIND T
01E5 3E05            MVI   A,5              ;SET UP FOR 5 RIGHT SHIFTS
                                             ;ON REGS DE
01E7 CD1E23          CALL  RSHIFT           ;T IS LOCATED IN DE
                ;
                                             ;LOAD SAM WITH T VALUE...
01EA EB              XCHG                   ;PUT T IN HL
01EB 225429          SHLD  SAM
01EE 00              NOP
01EF 013429          LXI   B,BFIG
01F2 0A              LDAX  B
01F3 B7              ORA   A                ;SET STATUS
01F4 C21002          JNZ   OVER6
01F7 3E0F            MVI   A,0FH
01F9 02              STAX  B                ;RESET BYTEFIG STATUS
01FA 223529          SHLD  TFA              ;SAVE AVERAGE
                ;
01FD C31002          JMP   OVER6
                ;
                ;
                ;
                                             ;THIS CODE STARTS PAGE 4
                                             ;ON THE FLOW CHART.....
                ;
                ;
                ;
                                             ;SUBROUTINE AVG:
                                             ;
                                             ;THIS ROUTINE WILL AVERAGE
                                             ;(16) 16 BIT NUMBERS AT TH
                                             ;STARTING ADDRESS LOCATED
                                             ;ALL REGISTERS ARE USED &
                                             ;IS STORED IN HL.
                ;
                ;
                                             ;AVERAGE 16 ZT SAMPLES AND
                                             ;STORE RESULT IN ZT16
0220 2E10    AVG:    MVI   L,10H            ;SET LOOP COUNTER
0222 E5              PUSH  H
0223 212322          LXI   H,20H            ;PUT ADDRESS FOR ZT IN B
                ;
0226 0A      AVG1:   LDAX  B
0227 5F              MOV   E,A
0228 03              INX   B
0229 0A              LDAX  B
022A 03              INX   B
022B 57              MOV   D,A
022C 19              DAD   D                ;ADD CURRENT VALUE TO HL A
022D E3              XTHL                   ;EXCHANG HL & STACK
022E 2D              DCR   L
022F E3              XTHL
0210 C22602          JNZ   AVG1
0213 D1              POP   D                ;REMOVE COUNTER FROM STACK
0214 3E04            MVI   A,4              ;SET UP FOR 4 SHIFTS
0216 EB              XCHG                   ;PUT SCOM ZT IN DE
0217 CD1E23          CALL  RSHIFT
021A EB              XCHG                   ;PUT AVERAGE ZT16 IN HL
021B C9              RET
                ;
021C 215722  OVER6:  LXI   H,ZTC
021F 35              DCR   M
0220 C24402          JNZ   ON5              ;SKIP ADJUSTMENT
0223 2A3528          LHLD  TFA
0226 EB              XCHG
0227 212A28          LXI   B,THRESH
022A CD3A23          CALL  COMP
022D D25A22          JNC   OVER7
```

```
0230 2A8528            LHLD   TPA        ;ADJUST GAIN ON AVERAGE
                                          ;FOUND DURING TP OF CYCLE
0233 EB               XCHG
0234 01AB23           LXI    B,P
0237 CD4F23           CALL   SCRT
        ;
023A 215728   OVER7:  LXI    H,ZTC
023D 369F             MVI    M,09FH
023F 22               NOP
        ;
                                          ;THIS IS THE START OF
                                          ;PAGE 5 ON THE FLOW
                                          ;CHART....
0240 212628   ON5:    LXI    H,TPOINT    ;DCR TPOINT
0243 35               DCR    M
0244 7E               MOV    A,M         ;LOAD TPOINT INTO A
0245 2A5428           LHLD   SAM         ;LOAD T INTO HL
0248 EB               XCHG               ;PUT T IN DE
0249 07               RLC
024A 4F               MOV    C,A
024B 0600             MVI    B,0
024D 21A828           LXI    H,T         ;LOAD T REG START ADDRESS
0250 09               DAD    B           ;CALC. NEXT ADDRESS
0251 73               MOV    M,E         ;STORE LSB OF T
0252 23               INX    H
0253 72               MOV    M,D         ;STORE MSB OF T
        ;
0254 2A5228           LHLD   TP
0257 EB               XCHG
0258 DB2A             IN     2AH         ;PUT TP IN DE
025A 77               RRC
025B E603             ANI    3
025D 4F               MOV    C,A         ;SAVE CURRENT H-VALUE
025E 47               MOV    B,A
025F 3E03             MVI    A,3
0261 90               SUB    B
0262 CD1B23           CALL   RSHIFT      ;SHIFT TP R (3-H-VALUE)
0265 3E02             MVI    A,52
0267 93               SUB    E
0268 FA7C22           JM     CTP
026B 79               MOV    A,C         ;PUT H-VAL INTO A
026C D603             SUI    3
026E CA7C22           JZ     CTP
0271 0C               INR    C           ;INCR HVAL
0272 DB2A             IN     2AH
0274 E6F9             ANI    0F9H
0276 47               MOV    B,A
0277 79               MOV    A,C
0278 07               RLC
0279 B0               ORA    B
027A D32A             OUT    2AH
                                          ;CLEAR TP & SAM
027C 212628   CTP:    LXI    H,2
027F 00               NOP
0282 225428           SHLD   SAM
0283 212628           LXI    H,TPOINT    ;DOES TPOINT=0?
0286 7E               MOV    A,M
0287 B7               ORA    A           ;SET FLAGS
0288 00               NOP
0289 C2D320           JNZ    ON2
028C 3E10             MVI    A,10H        ;SET TPOINT = 16
028E 77               MOV    M,A
                                          ;AVERAGE THE 16 T-NUMBERS
028F 01A828           LXI    B,T
0292 CD0C22           CALL   AVG
0295 222228           SHLD   T16          ;STORE VALUE
        ;
                                          ;CALC TWO
0298 0605             MVI    B,5
029A 2A2428           LHLD   TWO
029D EB               XCHG               ;MOVE T16 INTO HL
029E 2A2228           LHLD   T16
02A1 3E01    HERE3:   MVI    A,1
02A3 19               DAD    D
02A4 CD3123           CALL   LSHIFT
```

```
02A7 05                    DCR    B
02A8 C2A102                JNZ    HERE3
02AB 3E05                  MVI    A,5
02AD EB                    XCHG
02AE CD1E03                CALL   RSHIFT
02B1 EB                    XCHG
02B2 222428                SHLD   TWO           ;STORE 2-SEC AVG.
02B5 0601                  MVI    B,1           ;CALC BACK
02B7 2A2628                LHLD   BACK
02BA EB                    XCHG
02BB 2A2428                LHLD   TWO           ;BACK IS A 8 SEC AVERAGE
02BE 3E01        HERE4:    MVI    A,1
02C0 19                    DAD    D
02C1 CD3103                CALL   LSHIFT
02C4 05                    DCR    B
02C5 C2BE02                JNZ    HERE4
02C8 3E01                  MVI    A,1
02CA EB                    XCHG
02CB CD1E03                CALL   RSHIFT
02CE EB                    XCHG
02CF 2A2428                LHLD   TWO
                           ;
                           ;
02D2 EB                    XCHG
02D3 3E02                  MVI    A,2
02D5 CD3103                CALL   LSHIFT
02D8 EB                    XCHG
                           ;
02D9 1E26                  MVI    E,26H         ;CALC THRESH
02DB 1600                  MVI    D,0
02DD 19                    DAD    D
02DE 222A28                SHLD   THRESH
                           ;
                           ;  THIS SHIFTS THE ZCC VALUES.
                           ;
02E1 212F28                LXI    H,BDIFC+2
02E4 46                    MOV    B,M
02E5 23                    INX    H
02E6 4E                    MOV    C,M
02E7 23                    INX    H
02E8 56                    MOV    D,M
02E9 23                    INX    H
02EA 72                    MOV    M,D
02EB 2B                    DCX    H
02EC 71                    MOV    M,C
02ED 2B                    DCX    H
02EE 70                    MOV    M,B
02EF 00                    NOP
                           ;
                           ;  CHECK 3 VALUES FOR PROPER RANGE...
02F0 3E21                  MVI    A,21H         ;SET LOWER VALUE
02F2 1E03                  MVI    E,3           ;LOOP COUNTER = 3
02F4 BE         LOW:       CMP    M
02F5 D21103                JNC    OT            ;CHECK 3 CONSECUTIVE
02F8 23                    INX    H             ;VALUES FOR > THRESH
02F9 1D                    DCR    E
02FA C2F402                JNZ    LOW
02FD 00                    NOP
02FE 3E70                  MVI    A,70H         ;SET UPPER VALUE
0300 1E03                  MVI    E,3
0302 2B         HIGH:      DCX    H
0303 BE                    CMP    M
0304 DA1103                JC     OT
0307 1D                    DCR    E
0308 C20203                JNZ    HIGH          ;FALLS THRU AFTER
030B 00                    NOP                  ;3 LOOPS
030C 213328                LXI    H,BDIFC+6
030F 3600                  MVI    M,0           ;CLEAR BYTE IF 3 BYTES
                                                ;ARE IN RANGE
0311 00         OT:        NOP
                           ;
                           ;  CLEAR ZERO CROSS COUNTER
0312 210000                LXI    H,0           ;CLEAR ZC COUNTER
```

```
0315 222E28          SHLD    BDIFC+1
0318 00              NOP
0319 00              NOP
031A 00              NOP
031B 031822          JMP     CN2
```

;THIS IS A SUBROUTINE
;THAT DOES A RIGHT SHIFT
;ON THE DE REG PAIR. THE
;NUMBER OF SHIFTS IS PASSED
;THE ROUTINE IN THE A REG.

```
031E C5      RSHIFT: PUSH    B
031F B7              ORA     A           ;SET STATUS FLAGS, CLEAR C
0320 CA2F03          JZ      OVER5       ;RET IF SHIFT NUMBER IS 0.
0323 3D              DCR     A           ;DCR SHIFT COUNTER
0324 47              MOV     B,A
0325 7A              MOV     A,D         ;SHIFT DE RIGHT 1 BIT
0326 1F              RAR
0327 57              MOV     D,A
0328 7B              MOV     A,E
0329 1F              RAR
032A 5F              MOV     E,A
032B 78              MOV     A,B
032C C31F03          JMP     RSHIFT+1
032F C1      OVER5:  POP     B
0330 C9              RET
```

;THIS SUB IS A 16 BIT
;LEFT SHIFT ON THE DE REG
;NUMBER OF SHIFTS = A.

```
0331 B7      LSHIFT: ORA     A           ;SET STATUS FLAGS, CLEAR C
0332 C8              RZ
0333 3D              DCR     A
0334 EB              XCHG                ;SHIFT DE LEFT 1 BIT
0335 29              DAD     H
0336 EB              XCHG
0337 C33103          JMP     LSHIFT
```

;THIS SUB COMPARES DE TO A
;MEMORY LOCATION
;STORED IN BC. BC POINTS
;TO LSD. IF DE IS GREATER
;THAN OR = TO (BC) THEN
;CARRY FLAG IS SET.
;DE IS RETURNED. BC POINTS
;TO NEXT MEMORY LOCATION.

```
033A E5      CCMP:   PUSH    H           ;SAVE PSW & HL ON STACK
033B F5              PUSH    PSW
033C 0A              LDAX    B           ;LOAD 2'S COMP OF (B) IN H
033D 2F              CMA
033E 6F              MOV     L,A
033F 03              INX     B
0340 0A              LDAX    B
0341 2F              CMA
0342 67              MOV     H,A
0343 23              INX     H
0344 19              DAD     D
0345 F1              POP     PSW
0346 6F              MOV     L,A
0347 7C              MOV     A,H
0348 17              RAL                 ;MSB IS 0 IF RESULT IS + 0
0349 3F              CMC                 ;SHIFT MSB INTO CARRY & CC
034A 03              INX     B
034B 7D              MOV     A,L
034C F1              POP     H
```

```
034D 00                 NOP
034E C9                 RET
          ;
          ;
          ;
                                        ;THIS IS SUB SOFT.. IT
                                        ;COMPARES A VALUE IN THE B
                                        ;TO 16 TABLE VALUES POINTE
                                        ;TO BY PC.  THE A10 AMP IS
                                        ;LOADED WHEN THE RIGHT
                                        ;RANGE IS FOUND...

034F 2E00       SOFT:   MVI     L,0
0351 CD3A03     BACK1:  CALL    COMP            ;COMPARE ZT16 TO TABLE
0354 D26103             JNC     OVER4
0357 2C                 INR     L
0358 3E0F               MVI     A,0FH           ;CHECK LOOP COUNTER FOR 16
035A 95                 SUB     L
035B CA6103             JZ      OVER4
035E C35103             JMP     BACK1
0361 DB2B       OVER4:  IN      2BH             ;INPUT INHIBIT STATUS
0363 E622               ANI     22H
0365 C8                 RZ
0366 7D                 MOV     A,L             ;A NOW CONTAINS A10 NUMBER
0367 2F                 CMA
0368 E60F               ANI     0FH
          ;
          ;
036A 67                 MOV     H,A
036B 47                 MOV     B,A
036C DB2A                IN     2AH
036E 57                 MOV     D,A             ;SAVE OLD 10 D
036F 0F                 RRC
0370 0F                 RRC
0371 0F                 RRC
0372 E60F               ANI     0FH
0374 FE0B               CPI     0BH
0376 F28603             JP      NORM
0379 4F                 MOV     C,A
037A 90                 SUB     B
037B FEFC               CPI     -4
037D F28603             JP      NORM
0380 79                 MOV     A,C
0381 C604               ADI     4
0383 C38703             JMP     NORM1
0386 78         NORM:   MOV     A,B
0387 B7         NORM1:  ORA     A               ;CLEAR CARRY
0388 07                 RLC
0389 07                 RLC
038A 07                 RLC
038B 6F                 MOV     L,A
038C DB2A               IN      2AH             ;LOAD A10 VALUE
038E E687               ANI     87H
0390 B5                 ORA     L
0391 210028             LXI     H,2800H
0394 220A28             SHLD    TF
0397 213328             LXI     H,2833H         ;THIS CHECKS FOR PROPER ZC
039A 47                 MOV     B,A             ;VALUES BEFORE ADJUST
039B 7E                 MOV     A,M
039C B7                 ORA     A
039D C2                 RNZ
039E 360F               MVI     M,0FH
03A0 78                 MOV     A,B
03A1 D32A               OUT     2AH
03A3 C9                 RET
          ;
          ;
03A4 F5         TSW:    PUSH    PSW             ;SAVE ACCM. AND FLAG WORD
03A5 DB01               IN      1               ;GET SWITCH STATUS
03A7 E620               ANI     20H             ;ISOLATE STATUS
03A9 CA0606             JZ      TEST            ;JMP SELF TEST IF 0
```

```
03AC F1                  POP   PSW           ;ELSE RESTORE PSW
03AD C9                  RET
                         ;
S 03AE 44404057 P:       DW    44H,40H,57H,64H,6CH,7AH,85H,92H
S 03B2 57276262
S 03B6 6C6C7A85
S 03BA 85929292
  03BE A0AFB0C0          DW    0A5H,0B2H,0C0H,0DCH,0E3H,0F4H
  03C2 0CDCE3F4
  03C6 E5CCF4C0
  03CA 7AF12221          DW    102H,122H,13AH
  03CE 3A 1
                         ;
                         ;
                         ;
                         ;
                         ;SELFTEST
                         ;
                         ;
                         ;
                         ;###########################################
                         ;THIS IS THE SELF TEST PROGRAM FOR THE 8285 MICRO
                         ;THE TESTS ARE:
                         ;1-CPU AND ROM CONTENT CHECK
                         ;2-RAM AND TIMER CHECK
                         ;3-VOGAD A/D TEST
                         ;4-16 CHANNEL TEST
                         ;###########################################
 03DC                    ORG   6CCH
 2832                    MEMLOC EQU  2832H
                         ;###########################################
                         ;SET PDR AND C/S
                         ;###########################################
 2620 AF                 XRA   A
 0621 D312               OUT   2             ;SET PDR FOR PCB(BIT 21)
 0623 3ECB               MVI   A,0CBH        ;SET PDR FOR FOLLOWING BIT
                                             ;OF ROM PORT B(21):
                                             ;7-LED II  OUTPUT
                                             ;6-LED I   OUTPUT
                                             ;5-SELF TEST SWITCH
                                             ;          INPUT
                                             ;4-16 CHANNEL  INPUT
                                             ;3-SELF TEST PASSED
                                             ;          OUTPUT
 2625 D3 3               OUT   03H
 2627 3E12               MVI   A,12H         ;SET C/S REG
 0629 D325               OUT   25H
 262B 00                 NOP
 262C 00                 NOP
 262D 00                 NOP
 262E 00                 NOP
 262F 00                 NOP
 2610 00                 NOP
                         ;###########################################
                         ;1-CPU AND ROM CONTENT CHECK
                         ;###########################################
 0611 CD2407             CALL  CHECK         ;CHECK SBR INSTRUCTIONS
 0614 3EFF               MVI   A,0FFH        ;TEST PATTERN
 2616 213228             LXI   H,MEMLOC      ;CHECK H,L PAIR
 0619 77                 MOV   M,A           ;CHECK MOV
 261A EB                 XCHG
 2618 EB                 XCHG                ;CHECK XCHG AND D,E
 261C BE                 CMP   M             ;CHECK M POINTER
 061D C2 9C7             JNZ   FAIL
 2620 3E21               MVI   A,21H         ;TEST PATTERN
 0621 07                 RLC                 ;CHECK RLC INSTRUCTION
 0623 D02927             JNC   FAIL
 0626 0F                 RRC                 ;CHECK RRC INSTRUCTION
 2627 FE21               CPI   21H
 0629 C2 9C7             JNZ   FAIL
 062C 47                 MOV   B,            ;CHECK B
 062D 4F                 MOV   C,A           ;CHECK C
 262E B8                 CMP   B
 062F C2 9C7             JNZ   FAIL
```

```
0632 B9                  CMP    C
0633 C21907              JNZ    FAIL
0636 3EFF                MVI    A,0FFH        ;TEST PATTERN
0638 3D                  DCR    A             ;CHECK DCR
0639 3C                  INR    A             ;CHECK INR
063A FEFF                CPI    0FFH
063C C2 907              JNZ    FAIL
            ;ROM CONTENT CHECK 063F 210000              LXI    H,0           ;GET FIRST BYTE OF CODE
0642 46                  MOV    B,M
0643 23                  INX    H
0644 78        EXOR:     MOV    A,B
0645 AE                  XRA    M
                                              ;N+1
0646 07                  RLC
0647 47                  MOV    B,A
0648 23                  INX    H
0649 3E08                MVI    A,8H
064B BC                  CMP    H             ;ADDR
064C C24406              JNZ    EXOR
064F 78                  MOV    A,B
0650 E6FF                ANI    0FFH
0652 C21907              JNZ    FAIL          ;
0654 3E88                MVI    A,88H         ;LED PATTERN #1
0657 D301                OUT    01
0659 06FF                MVI    B,0FFH        ;255 MSEC DELAY
065B CDC907              CALL   WAIT
            ;########################################
            ;2-RAM AND TIMER CHECK
            ;########################################
            ;MEMORY CHECK
065E 210028              LXI    H,2800H       ;INIT. MEMORY POINTER
0661 3E21    MEMCEK:     MVI    A,21          ;LOAD MEMORY WITH
0663 77                  MOV    M,A           ;TEST PATTERN
0664 23                  INX    H
0665 3E29                MVI    A,29H         ;CHECK HI BYTE OF
                                              ;MEMORY POINTER TO
0667 BC                  CMP    H             ;SEE IF IT HAS CHANGED
0668 C26106              JNZ    MEMCEK        ;IF NOT, CONTINUE LOADING
                                              ;MEMORY
066B 210028              LXI    H,2800H
066E 7E      GETMEM:     MOV    A,M           ;GET TEST PATTERN\
066F FE21                CPI    21            ;IS THIS THE TEST
                                              ;PATTERN?
0671 C2 907              JNZ    FAIL          ;IF NOT TEST FAILS
0674 23                  INX    H
0675 3E29                MVI    A,29H         ;CHECK HI BYTE OF MEMORY
                                              ;POINTER TO SEE IF CHANGED
0677 BC                  CMP    H
0678 C26E06              JNZ    GETMEM        ;IF NOT COMPARE AGAIN
            ;TIMER COUNTER
067B 3E42    OVER:       MVI    A,42H         ;STOP TIMER
067D D328                OUT    28H
067F 3E40                MVI    A,40H         ;LOAD LO ORDER TIMER
0681 D32C                OUT    2CH
0683 3E40                MVI    A,040H        ;LOAD HI ORDER TIMER
0685 D32D                OUT    2DH
0687 3E02                MVI    A,702H        ;START TIMER
0689 D328                OUT    28H
068B DB28    BAC1:       IN     28H           ;READ C/S REGISTER
068D E640                ANI    40H           ;SET Z FLAG IF TIMER IS
                                              ;STILL COUNTING
068F CA8B06              JZ     BAC1
0692 3E48                MVI    A,48H         ;LED PATTERN 12
0694 D301                OUT    01H
0696 06FF                MVI    B,0FFH        ;256 MSEC DELAY
0698 CDC906              CALL   WAIT
            ;########################################
            ;3-VCOAD A/D CHECK
            ;########################################
069B 0E02                MVI    C,02          ;SET FOC COUNT
                                              ;SET HARRIS AMP CONTROL
069D DB2A    FOC:        IN     2AH           ;THIS CLEARS H1&H2 OUTPUT
069F E6F9                ANI    0F9H
06A1 D32A                OUT    2AH
06A3 0605                MVI    B,5
```

```
26A5 CD0920        CALL  WAIT        ;GENERATE START BIT LOW
26A8 F621          CRI   01
06AA F3            DI
26AB D32A          OUT   2AH         ;CLEAR BIT
26AD FEFE          ANI   0FEH
26AF D32A          OUT   2AH         ;OTHER INPUT INFO
06B1 FB            EI
06B2 D32A          OUT   2AH
06B4 00            NOP
06B5 00            NOP
06B6 00            NOP
26B7 00            NOP
26B8 DB2B          IN    2BH         ;CHECK FOR ECO LO
26BA E601          ANI   01H
06BC C2 907        JNZ   FAIL
26BF DB2B  CHANGE: IN    2BH         ;WAIT FOR ECC HI
26C1 E601          ANI   1
26C3 CA B26        JZ    CHANGE
26C6 0D            DCR   C
26C7 C29D26        JNZ   ECC         ;REPEAT TEST ONCE
26CA 3E2J          MVI   A,2H
26CC D301          OUT   01H         ;LED PATTERN 11
;##############################################
;4-16 CHANNEL AND HARRIS AMP TEST
;##############################################
06D0 3EFF          MVI   A,0FFH      ;OUTPUT 0'S TO PORT 2A
06D2 D32A          OUT   2AH
06D2 160A          MVI   D,0CH       ;INIT. 16 CHANNEL COUNT
26D4 1E20          MVI   E,20H       ;INIT. HARRIS AMP COUNT
26D6 DB01  LOOP1:  IN    01H         ;GET SELF TEST SWITCH
                                     ;STATUS
06D8 E620          ANI   20H
26DA C21F27        JNZ   STEND       ;JUMP TO END IF SELF
                                     ;TEST SWITCH IS HI
26DD DB01          IN    01H         ;CHECK MOMENTARY FOR LO
26DF E612          ANI   12H
26E1 C2D676        JNZ   LOOP1       ;
26E4 0614          MVI   B,20        ;WAIT 20 mSEC
26E6 CDC922        CALL  WAIT
06E9 DB01          IN    01          ;CHECK MOMENTARY FOR LO
06EB E612          ANI   12H
06ED C2D676        JNZ   LOOP1
26F0 14            INR   D           ;INCR 16 CH COUNT
26F1 1C            INR   E           ;INCR HARRIS AMP COUNT
26F2 7A            MOV   A,D
26F3 17            RAL
26F4 17            RAL
26F5 17            RAL
26F6 E670          ANI   70H
26F8 4F            MOV   C,A
26F9 7B            MOV   A,E
26FA 17            RAL
26FB E606          ANI   06H
26FD B1            ORA   C           ;COMPOSE BYTE TO OUTPUT
26FE 2F            CMA
26FF E6FE          ANI   0FEH
2701 D32A          OUT   2AH         ;OUTPUT TO RAM PORT B
2703 DB01  HOLD:   IN    01H         ;WAIT FOR HIGH ON
                                     ;MOMENTARY
2705 E612          ANI   12H
2707 CA0327        JZ    HOLD
270A 0614          MVI   B,20        ;WAIT 20 mSEC
270C CDC922        CALL  WAIT
270F DB01          IN    01H
2711 E612          ANI   12H
2713 CA0327        JZ    HOLD
2716 C3D626        JMP   LOOP1       ;RETURN TO CHECK SELF TEST
                                     ;SWITCH
2719 00            NOP
271A 00            NOP
271B 00            NOP
271C 00            NOP
271D 00            NOP
271E 00            NOP
;##############################################
;END OF SELF TEST
;##############################################
```

```
771F 8F18      STEND:  MVI   A,0FFH        ;TURN OFF LED'S
7721 D371              OUT   71
7723 C9                RET   C
;##################################################
;SUBROUTINES
;##################################################
;##################################
0724 AF        CHECK:  XRA   A
2725 C2 927            JNZ   FAIL
0728 C9                RET
;#################################
0729 C3 6C6.6  FAIL:   JMP   IOC81
;#################################
P23P                   END
```

Although a preferred embodiment has been described in the Detailed Description, it will be understood that the invention is capable of numerous modifications and rearrangements without departing from the spirit of the invention.

I claim:

1. A voice operated gain adjust apparatus for use in a voice processor that receives an analog input signal including voice signals and background noise, comprising:

means for converting the analog input signal into a digital input signal;

an amplifier having a variable gain for amplifying the analog input signal, said amplifier includes a plurality of different feedback loops and a switching circuit for connecting any of said feedback loops to the amplifier to determine the gain thereof; and controller means including a central processing unit, a nonvolatile memory for storing a program, and a volatile memory for use in executing the program, each of said memories being interconnected with said central processing unit, said controller means being responsive to the digital input signal and the stored program for detecting the presence and absence of voice signals in the analog input signal and for generating a control signal which is applied to said switching circuit for varying the gain of said amplifier according to the amplitude of the analog input signal occurring in selected time periods only when the presence of voice signals is detected.

2. A voice operated gain adjust apparatus for use in a voice processor that receives an analog input signal including voice signals and background noise, comprising:

means for converting the analog input signal into a digital input signal;

controller means including a central processing unit, a nonvolatile memory for storing a program, and a volatile memory for use in executing the program, each of said memories being interconnected with said central processing unit, said controller means being responsive to the digital input signal and the stored program for determining an average absolute amplitude of the analog input signal over first selected time periods, for determining a largest maximum absolute amplitude of the analog input signal occurring during a second selected time period that includes a plurality of first selected time periods, for determining a threshhold by adding a predetermined amount to the average of the average absolute amplitudes occurring in the second selected time period, and for comparing the largest maximum absolute amplitude occurring in the second selected time period to the threshold;

an amplifier having a variable gain for amplifying the analog input signal, said amplifier includes a plurality of different feedback loops and a switching circuit for connecting any of said feedback loops to the amplifier to determine the gain thereof, said controller means being operable to control said switching circuit to select the gain of the amplifier; and said controller means being operable to produce a control signal which is applied to said switching circuit to adjust the gain of said amplifier according to the average absolute amplitude of the first selected time period in which the largest maximum absolute amplitude occurred, the gain of said amplifier being adjusted only when the largest maximum absolute amplitude is greater than the threshold so that the gain of said amplifier is adjusted in response to the voice signals in said analog input signal.

3. The voice operated gain adjust apparatus of claim 2 wherein said controller means is operable to determine the frequency of said analog input signal, said controller means being operable to adjust the gain of said amplifier only when the frequency of the input signal is within predetermined frequency criteria.

4. The voice operated gain adjust apparatus of claim 2 wherein said controller means is operable to determine the frequency of said analog input signals for a plurality of selected time periods by counting the number of negative to positive transitions of the analog input signal in the selected time periods and is operable to adjust the gain of said amplifier only when the frequency of said analog input signal is within predetermined frequency criteria, said predetermined frequency criteria being chosen so that said controller means is operable to adjust the gain of said amplifier only in the presence of voice signals in the analog input signal.

5. The voice operated gain adjust apparatus of claim 4 wherein said controller means is operable to adjust the gain of said amplifier only when the frequency of the analog input signal is within a predetermined frequency range for a selected consecutive number of said selected time periods within an adjustment cycle of a number of said selected time periods.

6. The voice operated gain adjust apparatus of claim 4 wherein said controller means is operable to adjust the gain of said amplifier only when the frequency of the analog input signal is within a predetermined frequency range for three consecutive time periods in an adjustment cycle that includes twelve time periods.

7. The voice operated gain adjust apparatus of claim 2 wherein said controller means is operable to increase the gain of said amplifier only a predetermined amount in a single adjustment cycle of a selected time period.

8. The voice operated gain adjust apparatus of claim 2 wherein said controller means is responsive to an external inhibit signal indicating the absence of voice signals in said analog input signal, said controller means being operable to adjust the gain of said amplifier only in the absence of an inhibit signal.

9. Gain adjusting apparatus for adjusting the amplitude of an input signal in the presence of noise, comprising:

preamplification means for receiving and amplifying the input signal, said preamplification means including adjustment means for adjusting the gain thereof;

amplification means for receiving and amplifying the input signal, said amplification means including adjustment means for controlling the gain thereof;

an analog-to-digital converter responsive to the output of the preamplification means for producing a digital output signal corresponding to the input signal; and controller means responsive to the output signal of the digital-to-analog converter for distinguishing the noise on the input signal and for controlling the gain of said amplification means in response to the output of said analog-to-digital converter and for controlling the gain of said preamplification means to maintain the output thereof within the operating range of said analog-to-digital converter.

10. A voice operated gain adjusting apparatus for use in a voice processor that receives an analog input signal including voice signals and background noise, comprising:

input range adjusting means for sampling, amplifying and holding the analog input signal at a predetermined sampling frequency, the gain of said input range adjusting means being variable;

an analog-to-digital converter connected to the output of said input range adjusting means for producing a digital signal corresponding to the analog input signal;

controller means responsive to the digital signal to control the gain of said input range adjusting means to maintain the output thereof within the operating range of the analog-to-digital converter, said controller means further responsive to the digital signal for determining an average absolute amplitude of the analog input signal over first selected time periods, for determining a largest maximum absolute amplitude of the analog input signal occurring during a second selected time period that includes a plurality of first selected time periods, for determining a threshold by adding a predetermined amount to the average of the average absolute amplitudes occurring in the second selected time period, and for comparing the largest maximum absolute amplitude occurring in the second selected time period to the threshold;

an amplifier having a variable gain for amplifying the analog input signal, said amplifier including means for adjusting the gain thereof; and said controller means being operable to produce a control signal for being applied to said means for adjusting to adjust the gain of said amplifier according to the average absolute amplitude of the first selected time period in which the largest maximum absolute amplitude occurred, the gain of said amplifier being adjusted only when the largest maximum absolute amplitude is greater than the threshold so that the gain of said amplifier is adjusted in response to the voice signals in said analog input signal.

11. A voice operated gain adjusting apparatus for use in a voice processor that receives an analog input signal including voice signals and background noise, comprising:

a preamplifier connected to receive the analog input signal;

a plurality of feedback loops;

a switching circuit for connecting any of said feedback loops to said preamplifier to control the gain thereof;

an analog-to-digital converter connected to the output of said preamplifier for generating a digital signal corresponding to the analog input signal multiplied by the gain of said preamplifier;

controller means operable to control said switching circuit to select the gain of said preamplifier to maintain the output thereof within the operating range of said analog-to-digital converter, said controller means further responsive to the digital signal for determining an average absolute amplitude of the analog input signal over first selected time periods, for determining a largest maximum absolute amplitude of the analog input signal occurring during a second selected time period that includes a plurality of first selected time periods, for determining a threshold by adding a predetermined amount to the average of the average absolute amplitudes occurring in the second selected time period, and for comparing the largest maximum absolute amplitude occurring in the second selected time period to the threshold;

an amplifier having a variable gain for amplifying the analog input signal, said amplifier including means for adjusting the gain thereof; and said controller means being operable to produce a control signal for being applied to said means for adjusting to adjust the gain of said amplifier according to the average absolute amplitude of the first selected time period in which the largest maximum absolute amplitude occurred, the gain of said amplifier being adjusted only when the largest maximum absolute amplitude is greater than the threshold so that the gain of said amplifier is adjusted in response to the voice signals in said analog input signal.

12. A voice operated gain adjust apparatus for use in a voice processor that receives an analog input signal including voice signals and background noise, comprising:

first and second amplifiers for independently amplifying the input signal by first and second variable gains, respectively;

a first plurality of different feedback loops;

a second plurality of different feedback loops;

a first switching circuit for connecting any of said first feedback loops to said first amplifier to determine the gain thereof;

a second switching circuit for connecting any of said second feedback loops to said second amplifier to determine the gain thereof;

an analog to digital converter connected to the output of said second amplifier for producing a digital input signal corresponding to the analog input signal multiplied by the gain of said second amplifier;

a computer responsive to the digital input signal for calculating an average absolute amplitude of the analog input signal for a selected period of time, for determining the largest absolute amplitude of the analog input signal occurring in a selected period of time, for determining the frequency of the analog input signal by counting the number of negative to positive transitions in the digital input signal occurring in a selected time period, for generating a first control signal corresponding to voice signals in the analog input signal to control the gain of said first amplifier only when the largest absolute amplitude is greater than the average absolute amplitude by a specified amount and only when the frequency of the analog input signal is within predetermined frequency criteria, and for generating a second control signal corresponding to the digital input signal for controlling the gain of the said second amplifier;

means for applying the first control signal to the first switching circuit to adjust the gain of said first amplifier according to the amplitude of speech signals in the analog input signal; and means for applying the second control signal to the second switching circuit to adjust the gain of said second amplifier so that the output signal of the second amplifier is within the operating range of the analog to digital converter.

* * * * *